United States Patent [19]

Mettoudi et al.

[11] Patent Number: 4,862,111
[45] Date of Patent: Aug. 29, 1989

[54] MICROWAVE OSCILLATOR HAVING A DIELECTRIC RESONATOR, IN PARTICULAR FOR THE 22 GHZ RANGE

[75] Inventors: Isaac Mettoudi, Levallois-Perret; Francois Lafranca, Chelles, both of France

[73] Assignee: Societe Anonyme dite Alcatel Thomson Faisceaux Hertziens, France

[21] Appl. No.: 181,011

[22] Filed: Apr. 13, 1988

[30] Foreign Application Priority Data

Apr. 15, 1987 [FR] France .................................. 87 05360

[51] Int. Cl.4 ............................................. H03B 5/18
[52] U.S. Cl. ............................... 331/96; 331/99; 331/177 D; 333/232
[58] Field of Search ................... 331/96, 99, 107 SL, 331/117 D; 333/232

[56] References Cited

U.S. PATENT DOCUMENTS

| 4,588,964 | 5/1986 | Hirai et al. ........................ 331/96 X |
| 4,618,836 | 10/1986 | Gannon et al. ...................... 331/96 |
| 4,628,283 | 12/1986 | Reynolds ............................. 331/68 |

FOREIGN PATENT DOCUMENTS

| 0013174 | 7/1980 | European Pat. Off. . |
| 0121824 | 10/1984 | European Pat. Off. . |
| 59-194518 | 11/1984 | Japan ............................. 331/117 D |

Primary Examiner—Siegfried H. Grimm
Attorney, Agent, or Firm—Sughrue, Mion, Zinn, Macpeak & Seas

[57] ABSTRACT

A microwave oscillator having a dielectric resonator, in particular for use in the 22 GHz range, the oscillator comprising a negative resistance component (18) and a dielectric resonator (19) disposed on the surface of a substrate (13, 14) situated inside a housing (10), and the housing (10) being provided with a clearance situated over the dielectric resonator (19).

10 Claims, 2 Drawing Sheets

MICROWAVE OSCILLATOR HAVING A DIELECTRIC RESONATOR, IN PARTICULAR FOR THE 22 GHZ RANGE

REFERENCE TO RELATED APPLICATION

This application relates to application Ser. No. 181,010 filed Apr. 13, 1988, entitled "OSCILLATOR HAVING A DIELECTRIC RESONATOR, AND ELECTRONIC FREQUENCY TUNING USING A VARACTOR, IN PARTICULAR IN THE 22 GHz RANGE", to Isaace Mettoudi and assigned to the common assignee.

The present invention relates to a microwave oscillator having a dielectric resonator, in particular for the 22 GHz range (from 18 GHz to 24 GHz, for example).

BACKGROUND OF THE INVENTION

Since the new generation of microwave links and mobile relays operates in the 22 GHz range, it is becoming more and more necessary to use high stability sources having low power consumption and low cost. One means used for this purpose consists in using an oscillator including a solid-state component such as gallium arsenide field effect transistor (GaAs FET) stabilized by a dielectric resonator.

An oscillator of this type is described in U.S. Pat. No. 4,357,582. This patent describes a microwave oscillator comprising a field effect transistor disposed on a plane substrate. A first transmission line disposed on the substrate is connected to the gate of the transistor and is terminated by a matching impedance. A second transmission line is connected to the drain of the transistor and is disposed on the substrate at a predetermined angle relative to the first transmission line, with a third transmission line connected to the source of the transistor and disposed on the substrate in order to constitute an oscillation output. A dielectric resonator is disposed in the angle between the first and second transmission lines.

In said patent, the means used for adjusting the frequency of the oscillator consists in displacing a disk immediately over the dielectric resonator.

This highly practical means nevertheless suffers from the drawback of disturbing the field lines around the dielectric resonator. This gives rise to a reduction in Q factor.

The Q factor may vary between 1000, and 500 depending on the position of the disk over the dielectric resonator. This also gives rise to a reduction in frequency stability and in spectrum purity.

The object of the invention is to mitigate these drawbacks.

SUMMARY OF THE INVENTION

The present invention provides a microwave oscillator having a dielectric resonator, in particular for use in the 22 GHz range, the oscillator comprising a negative resistance component and a dielectric resonator disposed on the surface of a substrate situated inside a housing, and the housing being provided with a clearance situated over the dielectric resonator.

Advantageously, in such an oscillator, the field lines due to the dielectric resonator are only very slightly disturbed.

In an advantageous embodiment, the clearance is a chimney extending perpendicularly to the substrate and provided with tapping in which at least one closure screw is disposed, said screw having two threads, and containing an adjustable self-locking screw which is screwed into the chimney, with the double-threaded screw being fixed in the chimney by means of a lock nut and with the housing being provided with a lid in which the clearance is machined.

More particularly, the oscillator comprises said housing with two small plates of substrate welded on either side of a FET which is itself welded to housing ground. The drain of the FET is connected to a first or "drain" stripline. The gate of the FET is connected to a second or "gate" stripline, with the gate and the drain being biased by means of low impedance quarter circle lines and high impedance lines. The gate stripline is terminated at its end by a 50-ohm load, with a gap isolating the gate from said load. There is also a gap on the drain stripline for isolating the drain from the load connected to the outlet therefrom.

Advantageously, the housing is made of brass, the substrate is made of quartz, the transistor support is made of copper, and the screws are made of beryllium bronze.

Such characteristics in an oscillator of the invention provide better frequency stability as a function of temperature together with greater spectrum purity.

BRIEF DESCRIPTION OF THE DRAWINGS

An embodiment of the invention is described by way of example with reference to the accompanying drawings, in which.

MORE DETAILED DESCRIPTION

Figure 1:
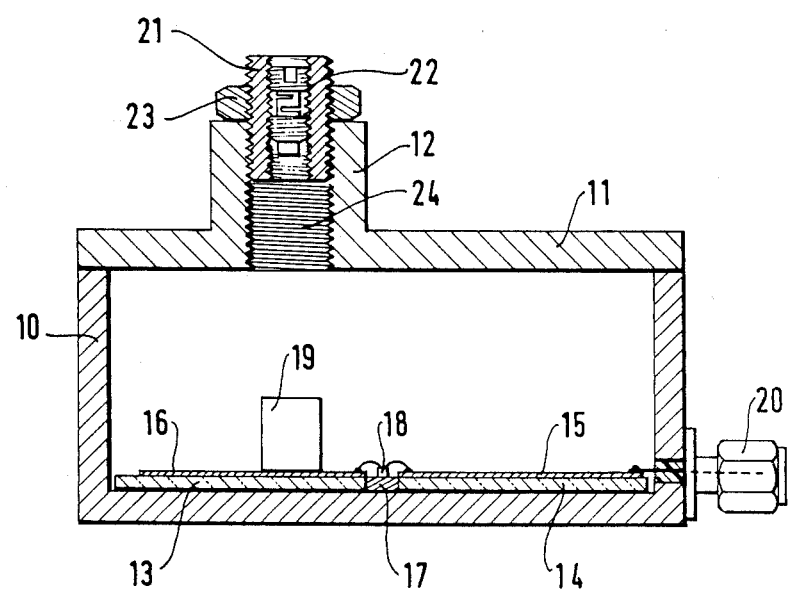
FIG. 1 is a section through an oscillator in accordance with the invention.

As shown in FIG. 1, an oscillator in accordance with the invention comprises:

a housing 10 which is generally rectangular in shape and which is closed by a lid 11 having a chimney 12;

a substrate disposed inside the housing and comprising two portions 13 and 14, with striplines 15 and 16 and a dielectric resonator 19 being disposed on the surface of the substrate;

a small support 17 welded to housing ground and disposed between the two portions 13 and 14 of the substrate, with a transistor 18 welded onto the support 17; and an outlet pin 20 fixed to the housing.

The chimney 12 provided in the lid of the housing is disposed over the resonator 19. As a result, the field lines due to the resonator are disturbed only very slightly. Frequency can be adjusted by means of a double-threaded screw (21, 22) associated with a lock nut 23.

The chimney 12 is machined directly in the lid 11 of the oscillator housing 10. The central bore 24 of the chimney 12 is immediately over the dielectric resonator 19. The inside of the chimney is tapped. A hollow screw 21 having inside and outside threads is screwed into the chimney. The double-threaded screw 21 is fixed relative to the chimney 12 by means of a lock nut 23.

An adjustable and self-locking screw 22 is screwed inside the double-threaded screw 21.

The bore 24 of the chimney 22 provides clearance for the field lines over the dielectric resonator 19.

An initial adjustment in oscillator frequency is obtained by means of the double-threaded hollow screw 21. Fine adjustment is obtained by means of the self-locking screw 22.

Whenever adjustment is being performed, a gap having a length of several millimeters must be provided between the inside edge of the lid 11 and the end of the double-threaded screw 21, as shown in FIG. 1.

Figure 2:
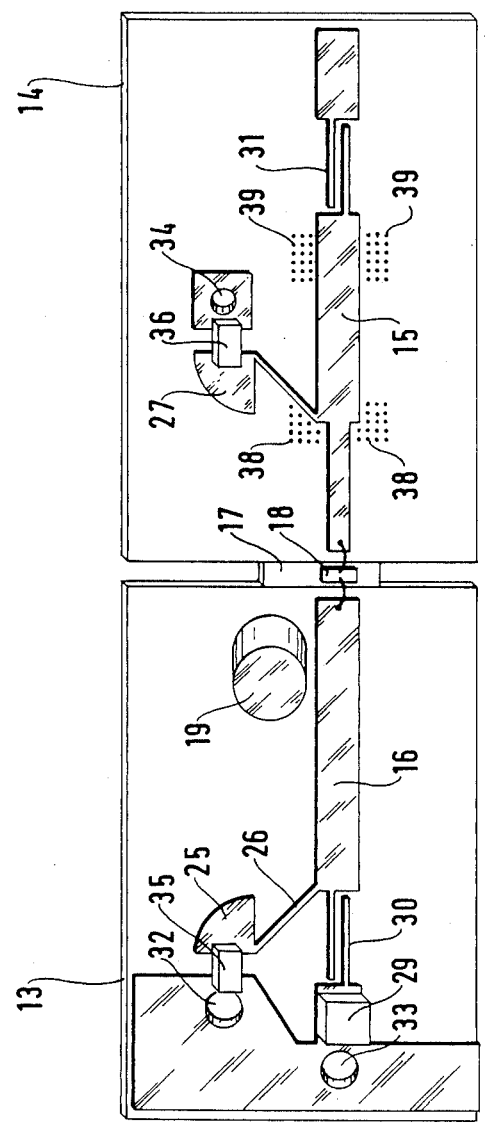
FIG. 2 is a plan view of a portion of the oscillator shown in FIG. 1.

In one embodiment, a 22 GHz oscillator having a dielectric resonator and in accordance with the invention comprises a housing 10 made of brass, for example, with two small plates 13 and 14 made of quartz, for example, welded thereto on either side of the transistor 18. The GaAs FET in the form if a chip is mounted on the support 17 which is made of copper, for example, and which is in turn welded to the ground of the housing 10 in order to provide good heat dissipation for the transistor. The drain of the transistor 18 is connected, as shown in FIG. 2, to a first or "drain" stripline 15. The gate is connected to a second or "gate" stripline 16. The gate is biased via a low impedance quarter circle line 25 and a high impedance line 26 which ensures that the influence of the bias circuit is negligible at operating frequencies. The drain is biased via a low impedance quarter circle line 27 and a high impedance line 28.

The gate strip line 16 is terminated at its end by a 50-ohm load 29. A gap 30 (i.e. a bandpass filter centered on the frequency of 22 GHz and having a minimum passband of 2.4 GHz, for example) serves to isolate the gate of the transistor from the 50-ohm load 29.

A similar gap 31 is to be found between the drain stripline 15 in order to isolate the drain of the transistor from the load connected to the outlet, not shown in FIG. 2.

The dielectric resonator 19 coupled to gate stripline 16 serves to determine the frequency output by the oscillator.

A lid 11, made of brass, for example, is disposed on top of the housing. The lid has a chimney 12 with a tapped bore machined therein. A double-threaded screw 21 made of beryllium bronze, for example, is screwed in the tapped bore. An adjustable and self-locking screw 22 made of beryllium bronze, for example, is screwed into the double-threaded screw 21. The device including the chimney thus constitutes a practical means for adjusting the output frequency of the oscillator and provides clearance for the field lines over the dielectric resonator 19.

The substrate shown in FIG. 2 also has plated-through holes 32, 33, and 34 for providing connections between the ground plane situated on the other side of the substrate and two decoupling capacitors 35 and 36.

The low impedance lines 25 and 27 are connected to pins (not shown in the figures) for applying the gate and drain bias signals, respectively.

Zones 38 and 39 constituted, for example, by depositing silver varnish, are provided on the surface of the substrate on either side of the stripline 15 in order to provide tuning stubs, and they are shown in order to illustrate a means for adjusting the impedance of the line 15 at two points.

The oscillator according to the invention retains a high Q factor while the frequency of the oscillator is being adjusted. This gives rise to better frequency stability as a function of temperature and a higher degree of spectrum purity from the oscillator.

Naturally the present example has been described and shown purely by way of preferred example and its component parts could be replaced by equivalent parts without thereby going beyond the scope of the invention. Thus, the clearance provided by the chimney 12 could be slightly offset relative to the dielectric resonator, for example by a few tenths of a millimeter.

Similarly, the FET could be replaced by a different negative resistance component, for example a GUNN diode.

We claim:

1. A microwave oscillator having a dielectric resonator, in particular for use in the 22 GHz range, said oscillator comprising: a housing, a substrate situated in said housing, a negative resistance component and a dielectric resonator disposed on a surface of said substrate, said housing including a chimney extending perpendicular to the surface of the substrate and providing a clearance over the dielectric resonator, said chimney being tapped on the inside surface thereof, and a double threaded, hollow screw having internal and external threads, said hollow screw being threaded in said chimney, and an adjustable self-locking screw, screwed in the hollow screw.

2. An oscillator according to claim 1, wherein the double-threaded hollow screw is fixed to the chimney by means of a lock nut.

3. An oscillator according to claim 1, wherein the housing is provided with a lid having the clearance machined therein.

4. An oscillator according to claim 1, wherein the negative resistance component is a filed effect transistor.

5. An oscillator according to claim 4, comprising the housing onto which two small plates of the substrate are welded on either side of the transistor which is mounted on a support which is itself welded to housing ground, the drain of said transistor being connected to a first, drain stripline, the gate thereof being connected to a second, gate stripline, gate bias and drain bias being provided via quarter circle low impedance lines and high impedance lines respectively, the gate stripline being terminated at its end by a 50-ohm load, a first gap being provided to isolate the gate from said 50-ohm load, and a second gap being provided on the drain stripline in order to isolate the drain from the load connected at the output.

6. An oscillator according to claim 1, wherein the housing is made of brass.

7. An oscillator according to claim 1, wherein the substrate is made of quartz.

8. An oscillator according to claim 5, wherein the support for the transistor is made of copper.

9. An oscillator according to claim 1, wherein the screws are made of beryllium bronze.

10. An oscillator according to claim 5, wherein zones of silver deposit are provided on either side of the drain stripline, at least at one location.

* * * * *